United States Patent
Kang et al.

(10) Patent No.: US 7,672,364 B2
(45) Date of Patent: Mar. 2, 2010

(54) SELF-CALIBRATION METHOD FOR USE IN A MOBILE TRANSCEIVER

(75) Inventors: Hyun-Il Kang, Hwaneong-si (KR);
Chang-Seok Lee, Daejeon (KR);
Jae-Kon Lee, Suwon-si (KR);
Young-Hwan Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 683 days.

(21) Appl. No.: 11/584,329

(22) Filed: Oct. 20, 2006

(65) Prior Publication Data
US 2007/0092023 A1 Apr. 26, 2007

(30) Foreign Application Priority Data
Oct. 20, 2005 (KR) ................. 10-2005-0099204

(51) Int. Cl.
*H04B 1/38* (2006.01)
(52) U.S. Cl. ................. 375/221; 375/219; 455/73
(58) Field of Classification Search ................. 375/219, 375/221, 224, 316, 319, 322, 324; 455/73, 455/67.11, 67.13, 67.14, 63.1, 110, 114.2, 455/115.1, 115.2, 126, 226.1, 295, 296
See application file for complete search history.

(56) References Cited

U.S. PATENT DOCUMENTS

| 2004/0106380 | A1* | 6/2004 | Vassiliou et al. | 455/73 |
| 2006/0034356 | A1* | 2/2006 | Fechtel | 375/219 |
| 2006/0223457 | A1* | 10/2006 | Rahman | 455/73 |

FOREIGN PATENT DOCUMENTS

| KR | 1995-0022192 | 7/1995 |
| KR | 1020040085962 | 10/2004 |

* cited by examiner

*Primary Examiner*—Betsy L Deppe
(74) *Attorney, Agent, or Firm*—The Farrell Law Firm, LLP (57) ABSTRACT

A method is provided for self-calibrating the mismatch and the direct current (DC) offset occurring in a mobile transceiver. The transmitter of the mobile terminal is used as a signal generator and the receiver thereof is used as a response characteristic measurer. The baseband processor calibrates the mismatch and the DC offset for the receiving and transmitting sides using a test signal received from the transmitter. When multiple input subcarriers are used in a mixer present on a reception stage, self-calibration is performed using multiple received test signals obtained from one transmission test signal.

6 Claims, 4 Drawing Sheets

SELF-CALIBRATION METHOD FOR USE IN A MOBILE TRANSCEIVER

PRIORITY

This application claims priority under 35 U.S.C. §119 to an application entitled "Self-Calibration Method for Use in a Mobile Transceiver" filed in the Korean Intellectual Property Office on Oct. 20, 2005 and assigned Serial No. 2005-99204, the contents of which are incorporated herein by reference.

BACKGROUND OF THE INVENTION

1. Field of the Invention

The present invention generally relates to a self-calibration method for use in a mobile transceiver, and more particularly to a method for self-calibrating a Direct Current (DC) offset and a mismatch between orthogonal signals occurring in a mobile transceiver.

2. Description of the Related Art

A mobile transceiver may be fundamentally degraded by non-ideal characteristics such as a Direct Current (DC) offset and mismatch (or in-phase/quadrature phase (I/Q) imbalance).

The DC offset is caused by self-mixing of a mixer provided in the mobile transceiver. The DC offset occurs when a local oscillator (LO) signal leaks inducing an input to an antenna and is subsequently fed back from the antenna or when a radio frequency (RF) modulation signal input to the antenna leaks to a LO. In this case, the DC offset value saturates a baseband (BB) circuit.

A fault occurring in the circuitry of the oscillator with a phase delay device and a line for connecting the oscillator and the mixer causes the mismatch. This is because the phase difference between I and Q channel signals generated from the oscillator of the mobile transceiver does not become 90 degrees. The mismatch can be reduced if mixers of I and Q channel demodulators are designed to be symmetrical to each other. However, there is a problem in that current consumption as well as a mixer size increases when the mixers are designed to be symmetrical. This mismatch decreases the signal-to-noise ratio (SNR) and therefore increases a bit error rate (BER). As a result, performance of the mobile transceiver is degraded.

Thus, a need exists for a method for estimating and calibrating the DC offset and the mismatch to improve the performance of the mobile transceiver.

Figure 1:
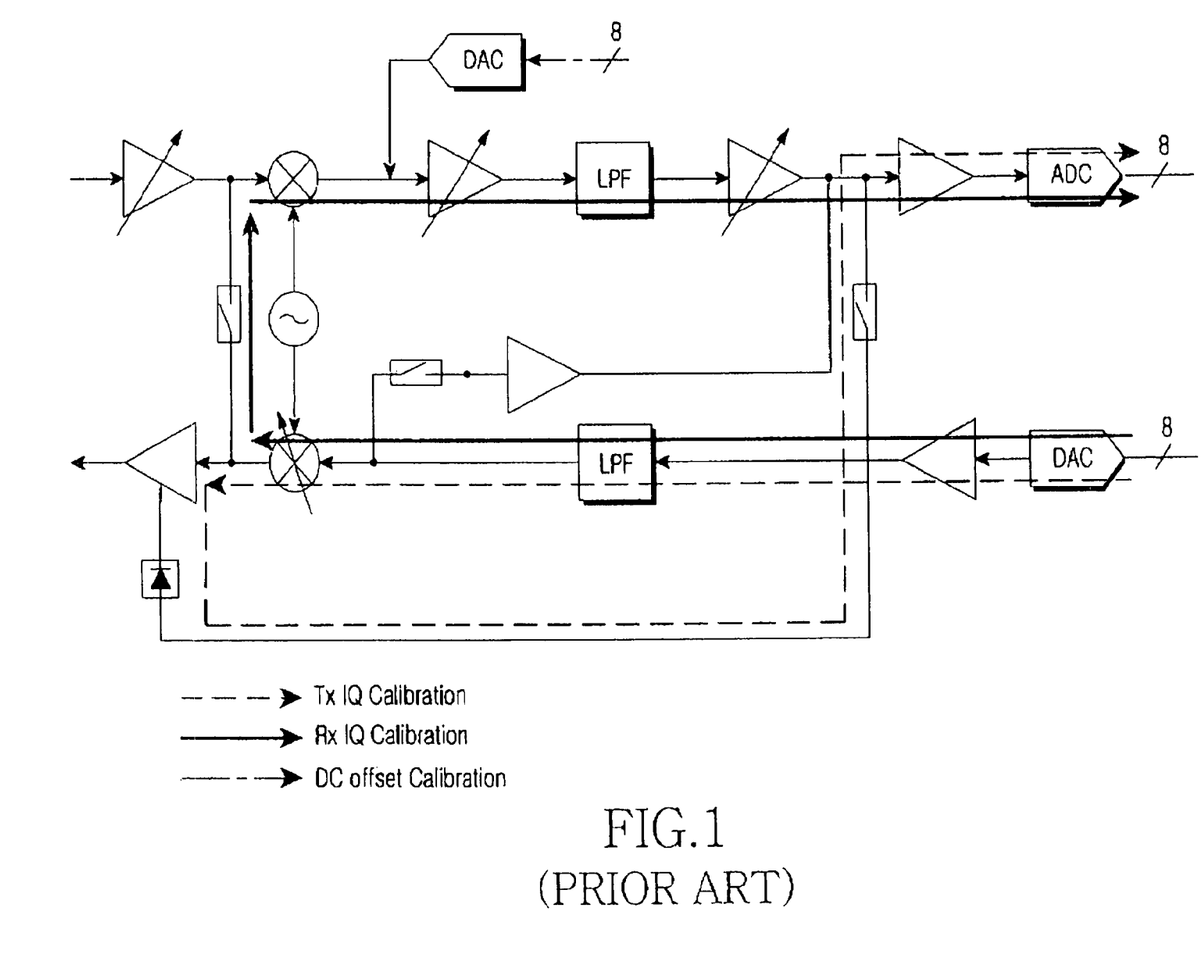
FIG. 1 is a circuit diagram of an example of independently estimating and correcting a mismatch and a direct current offset in a conventional mobile transceiver.

FIG. 1 is a circuit diagram illustrating an example of independently estimating and calibrating a mismatch and DC offset in a conventional mobile transceiver. The example of FIG. 1 is described in PCT International Publication Number WO 2004/023667 entitled "Direct-Conversion Transceiver Enabling Digital Calibration" and an article entitled "New Methods for Adaptation of Quadrature Modulators and Demodulators in Amplifier Linearization Circuits" by James K. Cavers.

For convenience of explanation, the estimation path is not divided into I and Q channel paths in FIG. 1. However, the same proposition holds true even when the estimation path is divided into the I and Q channel paths.

According to the method proposed in FIG. 1, all mismatches and DC offsets occurring in transmission (TX) and reception (RX) stages are calibrated. For this, the calibration for the TX stage is first performed and then the calibration for the RX stage is performed. That is, the calibration for the TX stage should be first performed before the calibration for the RX stage. The calibration for the TX stage is the TX IQ calibration. The calibration for the RX stage includes calibration of the DC offset as well as calibration of the mismatch between I and Q channels.

The estimation method using FIG. 1 uses a discrete envelope detector. The envelope detector converts an envelope signal output from a driver amplifier of the TX stage into a baseband (BB) signal, and takes the discrete Fourier series for the complex envelope waveform of the BB signal. The envelope detector estimates gain imbalance, phase imbalance and the DC offset of each of the I/Q channels in the TX stage using the discrete Fourier series.

In the case of the above-described estimation method, non-ideal factors of the envelope detector should be known. The non-ideal factors are differential gain and a DC value. In the above-described article and PCT International Publication Number WO 2004/023667, the non-ideal factors are estimated.

In the above-described method, the gain imbalance, the phase imbalance and the DC offset of each of the I/Q channels may not be correctly estimated in the TX and RX stages. As seen from FIG. 1, an increased number of diodes, resistors, capacitors and switches are additionally required to configure the envelope detector.

SUMMARY OF THE INVENTION

In view of the foregoing background, the present invention provides a method for independently estimating and calibrating a direct current (DC) offset and a mismatch.

The present invention also provides a method for estimating and calibrating a DC offset and a mismatch in a single path state in which transmitting and reception stages are connected.

The present invention further provides a method for estimating the DC offset of a reception stage using a test signal received from the reception stage by applying the test signal through an uncalibrated transmission stage.

In addition, the present invention provides a method for estimating the mismatch of a reception stage using a test signal received from the reception stage by applying the test signal through an uncalibrated transmission stage.

Moreover, the present invention provides a method for estimating the mismatch of a transmission stage using a test signal received from a calibrated reception stage by applying the test signal through an uncalibrated transmission stage.

In accordance with an aspect of the present invention, a self-calibration method for use in a transceiver includes generating an in-phase (I) channel test signal and a quadrature phase (Q) channel test signal in an analog baseband; converting the I and Q channel test signals generated in the analog baseband into radio frequency (RF) band signals and applying the RF band signals from a transmission stage to a reception stage through a test path; converting the applied RF band signals into analog baseband signals using a first carrier for the I channel and a first carrier for the Q channel applied as one pair and outputting a first I channel test signal and a first Q channel test signal; converting the applied RF band signals into analog baseband signals using a second carrier for the I channel and a second carrier for the Q channel applied as one pair and outputting a second I channel test signal and a second Q channel test signal; calibrating a direct current (DC) offset for the I channel reception signal in an analog baseband of the reception stage using an average value of the first and second I channel test signals; and calibrating an orthogonal offset for the Q channel reception signal in the analog baseband of the reception stage using the average value of the first and second Q channel test signals, wherein a phase difference between the first and second carriers for the I channel and the Q channel are 180 degrees, respectively.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail herein below with reference to the accompanying drawings.

The present invention may be embodied in many different forms and should not be construed as limited to the preferred embodiments set forth herein.

Before describing the preferred embodiments of the present invention in detail, the terms used in the description of the present invention are defined as follows.

$I_{TX}$ is an in-phase (I) channel test signal applied to an I channel path of a transmission (TX) stage to calibrate a direct current (DC) offset occurring in an I channel path of a reception (RX) stage and a mismatch between the I channel path and a quadrature phase (Q) channel path thereof and to calibrate a mismatch between the I channel path and a Q channel path of the TX stage.

$Q_{TX}$ is a Q channel test signal applied to the Q channel path of the TX stage to calibrate a DC offset occurring in the Q channel path of the RX stage and the mismatch between the I and Q channel paths thereof and to calibrate a mismatch between the I and Q channel paths of the TX stage. $Q_{TX}$ has a phase difference of 90 degrees from $I_{TX}$.

$V_{II}$ is a first I channel test signal corresponding to a baseband signal output by $LO_{II}$ when $I1_{TX}$ and $Q1_{TX}$ are output as radio frequency (RF) TX signals through mixers on the I and Q channel paths of the TX stage and are applied again as an input signal of the mixer corresponding to the RF RX signal on the I channel path of the RX stage.

$V_{IQ}$ is a second I channel test signal corresponding to a baseband signal output by $LO_{IQ}$ when $I1_{TX}$ and $Q1_{TX}$ are output as the RF TX signals through the mixers on the I and Q channel paths of the TX stage and are applied again as an input signal of the mixer corresponding to the RF RX signal on the I channel path of the RX stage.

$V_{QQ}$ is a first Q channel test signal corresponding to a baseband signal output by $LO_{QQ}$ when $I1_{TX}$ and $Q1_{TX}$ are output as the RF TX signals through the mixers on the I and Q channel paths of the TX stage and are applied again as an input signal of the mixer corresponding to the RF RX signal on the Q channel path of the RX stage.

$V_{QI}$ is a second Q channel test signal corresponding to a baseband signal output by $LO_{QI}$ when $I1_{TX}$ and $Q1_{TX}$ are output as the RF TX signals through the mixers on the I and Q channel paths of the TX stage and are applied again as an input signal of the mixer corresponding to the RF RX signal on the Q channel path of the RX stage.

$LO_{II}$ is a first carrier frequency used to convert the RF band signal on the I channel path of the RX stage into the baseband signal.

$LO_{IQ}$ is a second carrier frequency used to convert the RF band signal on the I channel path of the RX stage into the baseband signal and has a phase difference of 90 degrees from $LO_{II}$.

$LO_{QQ}$ is a first carrier frequency used to convert the RF band signal on the Q channel path of the RX stage into the baseband signal.

$LO_{QI}$ is a second carrier frequency used to convert the RF band signal on the Q channel path of the RX stage into the baseband signal and has a phase difference of 90 degrees from $LO_{QQ}$.

$LO_I$ is a carrier frequency used to convert the baseband signal on the I channel path of the TX stage into the RF band signal.

$LO_Q$ is a carrier frequency used to convert the baseband signal on the Q channel path of the TX stage into the RF band signal.

A structure and method for estimating a mismatch and a DC offset using a test signal will be described in detail when the test signal generated from a transmitting side is provided to a receiving side of a mobile terminal in accordance with an exemplary embodiment of the present invention. Herein, the test signal is a signal of a predefined form. For example, a simple sine/cosine wave signal is used for the test signal.

Figure 2:
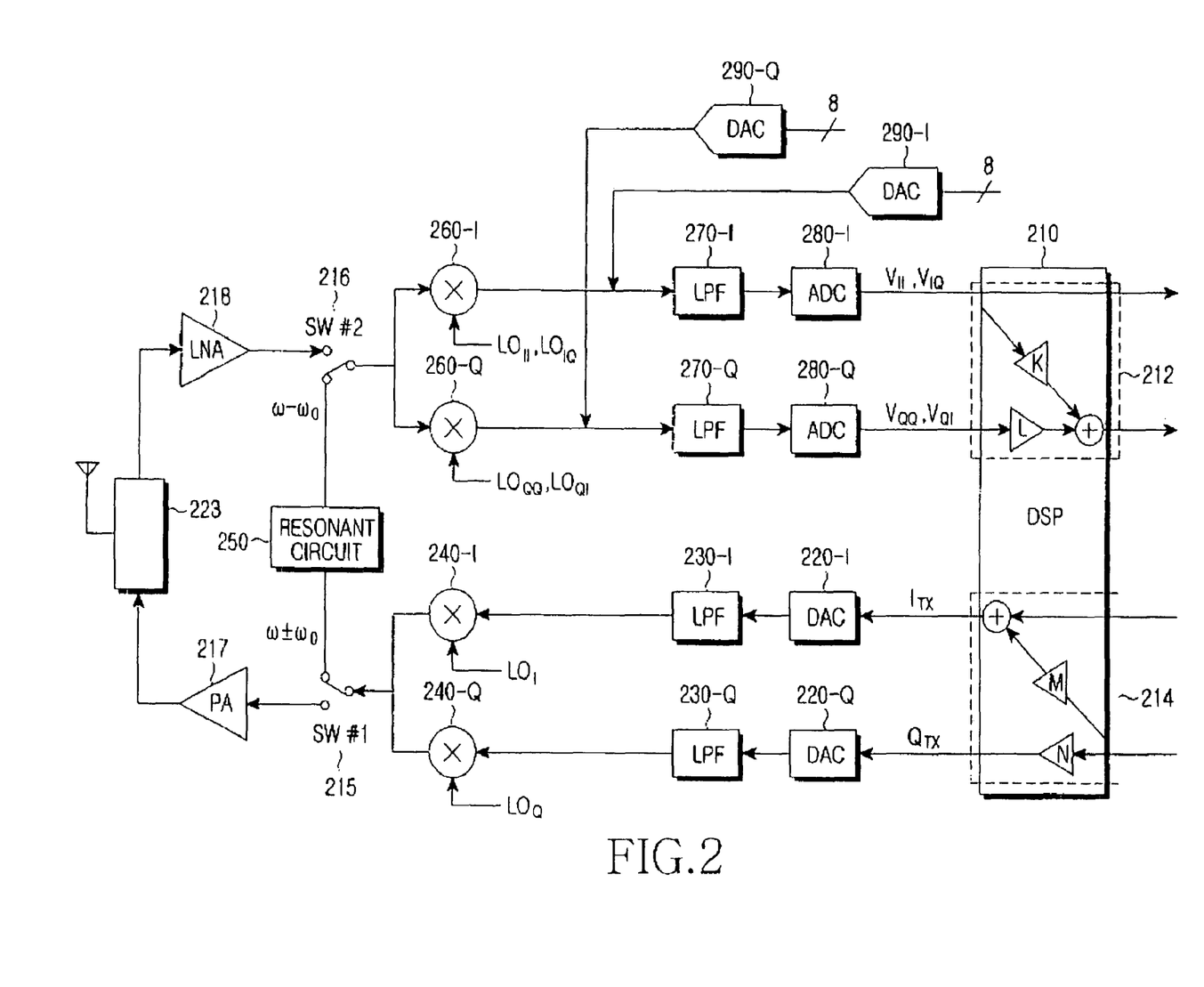
FIG. 2 is a schematic diagram of the structure of a typical mobile terminal in accordance with the present invention.

Referring to FIG. 2, the mobile terminal is provided with Digital-to-Analog Converters (DACs) 220-I and 220-Q, Low Pass Filters (LPFs) 230-I and 230-Q, and mixers 240-I and 240-Q on I and Q channel paths of a TX stage. Further, the mobile terminal is provided with mixers 260-I and 260-Q, LPFs 270-I and 270-Q, and Analog-to-Digital Converters (ADCs) 280-I and 280-Q on I and Q channel paths of an RX stage.

A Digital Signal Processor (DSP) 210 generates a predefined test signal, applies the predefined test signal to the TX stage, and estimates a DC offset and a mismatch of the RX stage using the test signal received through the RX stage. The DC offset and the mismatch of the RX stage can be calibrated using the estimated DC offset and the estimated mismatch. Alternatively, a mismatch of the TX stage is estimated using the calibrated RX stage, and the mismatch of the RX stage is calibrated using the estimated mismatch.

First, DSP 210 applies test signals to DAC 220-I and DAC 220-Q to estimate DC offsets for the I channel path and Q channel path of the RX stage. That is, $I_{TX}$ is applied to DAC 220-I and $Q_{TX}$ is applied to the DAC 220-Q. $I_{TX}$ and $Q_{TX}$ are applied at the same time.

For example, $I_{TX}$ and $Q_{TX}$ are defined as shown in Equation (1).

$$I_{TX} = \cos \omega_0 t$$

$$Q_{TX} = \sin \omega_0 t \qquad (1)$$

DAC 220-I converts the applied $I_{TX}$ into an analog signal and then inputs the analog signal to the LPF 230-I. The DAC 220-Q converts the applied $Q_{TX}$ into an analog signal and then inputs the analog signal to the LPF 230-Q. The $\omega_0$ is Base-Band's frequency.

After LPF 230-I filters $I_{TX}$ converted into the analog signal, mixer 240-I converts it into an RF band. After LPF 230-Q filters $Q_{TX}$ converted into the analog signal, mixer 240-Q converts it into an RF band. A carrier in mixer 240-I is $LO_I$, and a carrier in mixer 240-Q is $LO_Q$. $LO_I$ and $LO_Q$ are defined as shown in Equation (2).

$$LO_I = \cos \omega t$$

$$LO_Q = \alpha 1 \sin(\omega t + \phi 1) \quad (2)$$

where $\alpha 1$ is the gain imbalance value between the I and Q channel paths of the TX stage, and $\phi 1$ is the phase imbalance value between the I and Q channel paths of the TX stage. The $\omega$ is LO's frequency.

The conversion to the RF band in mixers 240-I and 240-Q, an RF TX signal includes a $(\omega \pm \omega_0)$ component. The RF TX signal with the $(\omega \pm \omega_0)$ component is transferred to the RX stage through a test path formed by a first switch SW#1 (215) and a second switch SW#2 (216).

A resonant circuit 250 present on the test path removes a $(\omega + \omega_0)$ component from the $(\omega \pm \omega_0)$ component included in the RF TX signal. Thus, the RF TX signal transferred to the RX stage through the second switch SW#2 includes only a $(\omega - \omega_0)$ component.

Mixer 260-I present on the I channel path converts an RF RX signal applied to the RX stage through the second switch SW#2(216) into a baseband signal. For this, mixer 260-I uses two subcarriers $LO_{II}$ and $LO_{IQ}$ with a phase difference of 180 degrees. These subcarriers are used to obtain two different output signals (of first and second I channel test signals $V_{II}$ and $V_{IQ}$) from one RF RX signal. The two subcarriers $LO_{II}$ and $LO_{IQ}$ are defined as shown in Equation (3).

$$LO_{II} = \cos \omega t$$

$$LO_{IQ} = -\cos \omega t \quad (3)$$

Mixer 260-Q present on the Q channel path converts an RF RX signal applied to the RX stage through the second switch SW#2(216) into a baseband signal. For this, mixer 260-Q uses two subcarriers $LO_{QQ}$ and $LO_{QI}$ with a phase difference of 180 degrees. These subcarriers are used to obtain two different output signals (of first and second Q channel test signals $V_{QQ}$ and $V_{QI}$) from one RF RX signal. The two subcarriers $LO_{QQ}$ and $LO_{QI}$ are defined as shown in Equation (4).

$$LO_{QQ} = \alpha 2 \sin(\omega t + \phi 2)$$

$$LO_{QI} = -\alpha 2 \sin(\omega t + \phi 2) \quad (4)$$

where, $\alpha 2$ is the gain imbalance value between the I and Q channel paths of the RX stage, and $\phi 2$ is the phase imbalance value between the I and Q channel paths of the RX stage.

In detail, the RF RX signals are provided to mixers 260-I and 260-Q. Mixer 260-I converts the RF RX signal into a baseband signal according to $LO_{II}$, and mixer 260-Q converts the RF RX signal into a baseband signal according to $LO_{QQ}$.

LPF 270-I on the I channel path filters the baseband signal output from mixer 260-I and then transfers the filtered signal to ADC 280-I. ADC 280-I converts the filtered signal into a digital signal. The digital signal obtained by the conversion is $V_{II}$. LPF 270-Q on the Q channel path filters the baseband signal output from mixer 260-Q and then transfers the filtered signal to ADC 280-Q. ADC 280-Q converts the filtered signal into a digital signal. The digital signal obtained by the conversion is $V_{QQ}$.

Then, mixer 260-I converts the RF RX signal into a baseband signal according to $LO_{IQ}$, and mixer 260-Q converts the RF RX signal into a baseband signal according to $LO_{QI}$.

LPF 270-I on the I channel path filters the baseband signal output from mixer 260-I and then transfers the filtered signal to ADC 280-I. ADC 280-I converts the filtered signal into a digital signal. The digital signal obtained by the conversion is $V_{IQ}$. LPF 270-Q on the Q channel path filters the baseband signal output from mixer 260-Q and then transfers the filtered signal to ADC 280-Q. ADC 280-Q converts the filtered signal to a digital signal. The digital signal obtained by the conversion is $V_{QI}$.

$V_{II}$, $V_{IQ}$, $V_{QQ}$, and $V_{QI}$ are provided to DSP 210. The DSP estimates a DC offset $\Delta I$ on the I channel path of the RX stage according to $V_{II}$ and $V_{IQ}$ and estimates a DC offset $\Delta Q$ on the Q channel path of the RX stage according to $V_{QQ}$ and $V_{QI}$. $\Delta I$ and $\Delta Q$ can be estimated by Equation (5).

$$\Delta I = \frac{V_{II} + V_{IQ}}{2} \quad (5)$$

$$\Delta Q = \frac{V_{QQ} + V_{QI}}{2}$$

As seen from Equation (5), $\Delta I$ can be estimated with an average value of the test signals $V_{II}$ and $V_{IQ}$ successively received through the I channel path of the RX stage, and $\Delta Q$ can be estimated with an average value of the test signals $V_{QQ}$ and $V_{QI}$ successively received through the Q channel path of the RX stage.

The DSP sets calibration values for calibrating $\Delta I$ and $\Delta Q$.

The value for calibrating $\Delta I$ is transferred to DAC 290-I and is converted into an analog signal. The calibration value for calibrating $\Delta Q$ is transferred to DAC 290-Q and is converted into an analog signal.

The value for calibrating $\Delta I$ converted into the analog signal cancels out the DC offset of a received signal in an analog baseband present on the I channel path of the RX stage. The analog baseband present on the I channel path of the RX stage is mapped to an interval from the output of mixer 260-I to the input of LPF 270-I.

The value for calibrating $\Delta Q$ converted into the analog signal cancels out the DC offset of a received signal in the analog baseband present on the Q channel path of the RX stage. The analog baseband present on the Q channel path of the RX stage is mapped to an interval from the output of mixer 260-Q to the input of LPF 270-Q.

Subcarriers applied to mixers 260-I and 260-Q are changed to estimate the mismatch between the I and Q channel paths of the RX stage. Two carriers $LO_{II}$ and $LO_{IQ}$ applied to mixer 260-I are shown in Equation (6) as an example. Further, two carriers $LO_{QQ}$ and $LO_{QI}$ applied to the mixer 260-Q are signals with a phase difference of 90 degrees and are shown in Equation (7) as an example.

$$LO_{II} = \cos \omega t$$

$$LO_{IQ} = \sin \omega t \quad (6)$$

$$LO_{QQ} = \alpha 2 \sin(\omega t + \phi 2)$$

$$LO_{QI} = \alpha 2 \cos(\omega t + \phi 2) \quad (7)$$

where, $\alpha 2$ is a gain imbalance value between the I and Q channel paths of the RX stage, and $\phi 2$ is a phase imbalance value between the I and Q channel paths of the RX stage.

The RF RX signals are provided to mixers 260-I and 260-Q. Mixer 260-I converts the RF RX signal into a baseband signal according to $LO_{II}$ and then outputs the baseband signal. Mixer 260-Q converts the RF RX signal into a baseband signal according to $LO_{QQ}$ and then outputs the baseband signal.

LPF 270-I on the I channel path filters the baseband signal output from mixer 260-I and then transfers the filtered signal to ADC 280-I. It converts the filtered signal into a digital signal. The digital signal obtained by the conversion is $V_{II}$. LPF 270-Q on the Q channel path filters the baseband signal output from mixer 260-Q and then transfers the filtered signal to ADC 280-Q. It converts the filtered signal into a digital signal. The digital signal obtained by the conversion is $V_{QQ}$.

Then, mixer 260-I converts the RF RX signal into a baseband signal according to $LO_{IQ}$, and mixer 260-Q converts the RF RX signal into a baseband signal according to $LO_{QI}$.

LPF 270-I coupled to the I channel path filters the baseband signal output from mixer 260-I and then transfers the filtered signal to the ADC 280-I, which converts the filtered signal into a digital signal. The digital signal obtained by the conversion is $V_{IQ}$. LPF 270-Q coupled to the Q channel path filters the baseband signal output from mixer 260-Q and then transfers the filtered signal to ADC 280-Q. The ADC 280-Q converts the filtered signal into a digital signal. The digital signal obtained by the conversion is $V_{QI}$.

$V_{II}$, $V_{IQ}$, $V_{QQ}$, and $V_{QI}$ are provided to DSP 210. It estimates imbalance values $\alpha 2$ and $\phi 2$ between the I and Q channel paths of the RX stage according to $V_{II}$, $V_{IQ}$, $V_{QQ}$, and $V_{QI}$. $\alpha 2$ and $\phi 2$ can be estimated by Equation (8).

$$\alpha 2 = \sqrt{\frac{V_{QQ}^2 + V_{QI}^2}{V_{II}^2 + V_{IQ}^2}} \qquad (8)$$

$$\phi 2 = \tan^{-1}\left(\frac{V_{II} \cdot V_{QQ} - V_{IQ} \cdot V_{QI}}{V_{II} \cdot V_{QI} + V_{QQ} \cdot V_{IQ}}\right)$$

Where, $\alpha 2$ is a gain imbalance value between the I and Q channel paths of the RX stage, and $\phi 2$ is a phase imbalance value between the I and Q channel paths of the RX stage.

DSP 210 computes calibration values K and L for calibrating the mismatch of the RX stage using the estimated $\alpha 2$ and $\phi 2$ values. K and L can be computed by Equation (9).

$$K = -\tan\phi 2 \qquad (9)$$

$$L = \frac{1}{\alpha 2 \cos\phi 2}$$

A first calibrator 212 of DSP 210 calibrates the mismatch between I and Q channel reception signals according to the computed K and L values. The mismatch is calibrated such that the I and Q channel reception signals have the desired phase difference of 90 degrees. Thus, the mismatch is calibrated with respect to one of the I and Q channel reception signals. In FIG. 2, it is assumed that the Q channel reception signal is calibrated.

The first calibrator 212 outputs a Q channel reception signal in which the mismatch has been calibrated by adding the Q channel reception signal multiplied by the calibration value L and the I channel reception signal multiplied by the calibration value K. The mismatch calibration performed by the first calibrator 212 can be defined as shown in Equation (10).

$$Q_{TX\_calibration} = K \times I_{RX} + L \times Q_{RX} \qquad (10)$$

Where $Q_{TX\_calibration}$ is the Q channel reception signal in which the mismatch has been calibrated, $I_{RX}$ is the I channel reception signal, and $Q_{RX}$ is the Q channel reception signal.

At last, DSP 210 applies test signals to the I and Q channel paths of the TX stage to estimate a mismatch thereof. The test signals $I_{TX}$ and $Q_{TX}$ are defined as shown in Equation (11).

$$I_{TX} = 0$$

$$Q_{TX} = 1 \qquad (11)$$

After test signals $I_{TX}$ and $Q_{TX}$ are applied to the TX stage, they are received through the I and Q channel paths of the RX stage. Because the procedure for receiving $V_{II}$ and $V_{QQ}$ in the RX stage when $I_{TX}$ and $Q_{TX}$ are applied to the TX stage is the same as the above-described procedure, a detailed description is omitted.

DSP 210 estimates the mismatch between the I and Q channel paths of the TX stage according to $I_{RX}$ and $Q_{RX}$. $\alpha 1$ and $\phi 1$ can be estimated by Equation (12).

$$\alpha 1 = \sqrt{V_{II}^2 + V_{QQ}^2} \qquad (12)$$

$$\phi 1 = \tan^{-1}\frac{V_{II}}{V_{QQ}}$$

Where $\alpha 1$ is a gain imbalance value between the I and Q channel paths of the TX stage, and $\phi 1$ is a phase imbalance value between the I and Q channel paths of the TX stage.

DSP 210 computes calibration values M and N for calibrating the mismatch of the TX stage using the estimated $\alpha 1$ and $\phi 1$ values. The calibration values M and N can be computed by Equation (13).

$$M = -\tan\phi 1 \qquad (13)$$

$$N = \frac{1}{\alpha 1 \cos\phi 1}$$

A second calibrator 214 of DSP 210 outputs calibration values for calibrating a mismatch between I and Q channel transmission signals according to the computed M and N values. The mismatch is calibrated such that the I and Q channel transmission signals have a desired phase difference of 90 degrees. Thus, a TX RF output has a desired signal from which an image signal has been excluded.

The second calibrator 214 outputs a pre-distorted I channel transmission signal such that the mismatch can be calibrated by adding the Q channel transmission signal multiplied by the calibration value M to the I channel transmission signal. Further, the second calibrator 214 outputs a pre-distorted Q channel transmission signal such that the mismatch can be calibrated by multiplying the Q channel transmission signal by the calibration value N.

Figure 3:
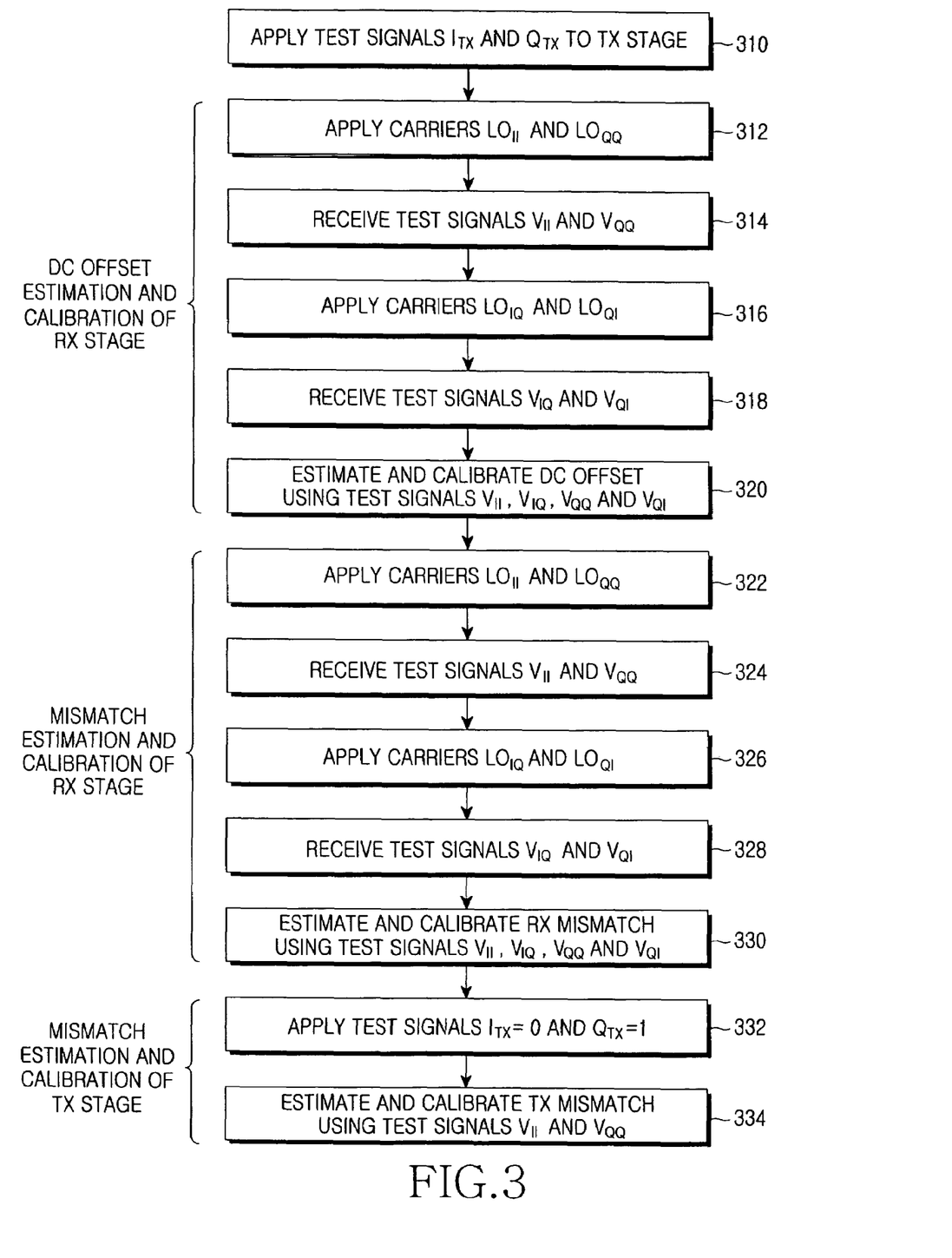
FIG. 3 is a flowchart illustrating the operation of a digital signal processor (DSP) for self-calibration in accordance with the present invention.

FIG. 3 is a flowchart illustrating an operation of the DSP for self-calibration in accordance with the present invention. In FIG. 3, steps 310 to 320 implement a process for calibrating the DC offset of the RX stage, steps 322 to 330 implement a process for calibrating the mismatch of the RX stage, and steps 332 and 334 implement a process for calibrating the mismatch of the TX stage.

Referring to FIG. 3, the DSP applies baseband test signals $I_{TX}$ and $Q_{TX}$ to the TX stage in step 310. At this time, the test signal $I_{TX}$ is applied to the I channel path, and the test signal $Q_{TX}$ is applied to the Q channel path.

In step 312, the DSP applies $LO_{II}$ to mixer 260-I present on the I channel path of the RX stage and applies $LO_{QQ}$ to mixer 260-Q present on the Q channel path of the RX stage. Herein, $LO_{II}$ and $LO_{QQ}$ are the carriers defined to calibrate the DC offset and are shown in Equations (3) and (4).

An RF RX signal applied to mixer 260-I is output as a baseband signal according to $LO_{II}$. The baseband signal is applied to the DSP through LPF 270-I and ADC 280-I present on the I channel path. Further, the RF RX signal applied to mixer 260-Q is output as a baseband signal according to LO$_{QQ}$. The baseband signal is applied to the DSP through LPF 270-Q and ADC 280-Q present on the Q channel path.

In step 314, the DSP receives V$_{II}$ applied through the I channel path and V$_{QQ}$ applied through the Q channel path.

In step 316, the DSP applies LO$_{IQ}$ to mixer 260-I present on the I channel path of the RX stage and applies LO$_{QI}$ to mixer 260-Q present on the Q channel path of the RX stage. Herein, LO$_{IQ}$ and LO$_{QI}$ are the carriers defined to calibrate the DC offset and are shown in Equations (3) and (4).

The RF RX signal applied to mixer 260-I is output as a baseband signal according to LO$_{IQ}$. The baseband signal is applied to the DSP through LPF 270-I and ADC 280-I present on the I channel path. Further, the RF RX signal applied to mixer 260-Q is output as a baseband signal according to LO$_{QI}$. The baseband signal is applied to DSP 210 through LPF 270-Q and the ADC 280-Q present on the Q channel path.

In step 318, the DSP receives V$_{IQ}$ applied through the I channel path and V$_{QI}$ applied through the Q channel path. The received test signals V$_{II}$, V$_{IQ}$, V$_{QQ}$, and V$_{QI}$ are generated from the test signals I$_{TX}$ and Q$_{TX}$ applied to the TX stage and the carriers LO$_{II}$, LO$_{IQ}$, LO$_{QQ}$, and LO$_{QI}$. As seen from Equation 3, LO$_{IQ}$ and LO$_{II}$ have a phase difference of 180 degrees. As seen from Equation 4, LO$_{QI}$ and LO$_{QQ}$ have a phase difference of 180 degrees.

In step 320, the DSP sets DC offset calibration values for canceling out DC offsets of the I and Q channel paths using the received test signals V$_{II}$, V$_{IQ}$, V$_{QQ}$, and V$_{QI}$. The DC offset calibration values can set the DC offsets estimated by Equation (5). In step 320, the DSP converts the set DC offset calibration values into analog signals to provide the analog signals to the RX stage, such that the DC offsets of the I and Q channel reception signals are calibrated.

In step 322, the DSP applies LO$_{II}$ to mixer 260-I present on the I channel path of the RX stage and applies LO$_{QQ}$ to mixer 260-Q present on the Q channel path of the RX stage. Herein, LO$_{II}$ and LO$_{QQ}$ are the carriers defined to calibrating an RX mismatch and are shown in Equations (6) and (7) as the example.

The RF RX signal applied to mixer 260-I is output as a baseband signal according to LO$_{II}$. The baseband signal is applied to the DSP through LPF 270-I and ADC 280-I present on the I channel path. Further, the RF RX signal applied to mixer 260-Q is output as a baseband signal according to LO$_{QQ}$. The baseband signal is applied to the DSP through LPF 270-Q and ADC 280-Q present on the Q channel path.

In step 324, the DSP receives V$_{II}$ applied through the I channel path and V$_{QQ}$ applied through the Q channel path.

In step 326, the DSP applies LO$_{IQ}$ to mixer 260-I present on the I channel path of the RX stage and applies LO$_{QI}$ to mixer 260-Q present on the Q channel path of the RX stage. Herein, LO$_{IQ}$ and LO$_{QI}$ are the carriers defined to calibrate an RX mismatch and are shown in Equations (6) and (7).

The RF RX signal applied to mixer 260-I is output as a baseband signal according to LO$_{IQ}$. The baseband signal is applied to the DSP through LPF 270-I and ADC 280-I present on the I channel path. Further, the RF RX signal applied to mixer 260-Q is output as a baseband signal according to LO$_{QI}$. The baseband signal is applied to the DSP through LPF 270-Q and ADC 280-Q present on the Q channel path.

In step 328, the DSP receives V$_{IQ}$ applied through the I channel path and V$_{QI}$ applied through the Q channel path. The received test signals V$_{II}$, V$_{IQ}$, V$_{QQ}$, and V$_{QI}$ are generated from the test signals I$_{TX}$ and Q$_{TX}$ applied to the TX stage and the carriers LO$_{II}$, LO$_{IQ}$, LO$_{QQ}$, and LO$_{QI}$. As seen from Equation (6), LO$_{IQ}$ and LO$_{II}$ have a phase difference of 90 degrees. As seen from Equation (7), LO$_{QI}$ and LO$_{QQ}$ have a phase difference of 90 degrees.

In step 330, the DSP estimates a gain imbalance value α2 and a phase imbalance value φ2 using the received test signals V$_{II}$, V$_{IQ}$, V$_{QQ}$, and V$_{QI}$. The gain imbalance value φ2 and the phase imbalance value φ2 can be estimated by Equation (8).

Further, the DSP computes calibration values K and L for calibrating a mismatch between the I and Q channel paths of the RX stage using the gain imbalance value α2 and the phase imbalance value φ2. The calibration values K and L are computed using Equation (9).

The DSP calibrates the mismatch between the I and Q channel reception signals in the RX stage according to the calibration values K and L. The mismatch can be calibrated by adding the I channel reception signal multiplied by K and the Q channel reception signal multiplied by L and outputting a resulting Q channel reception signal.

In step 332, the DSP applies the test signals I$_{TX}$ and Q$_{TX}$ for calibrating the mismatch of the RX stage to the TX stage. At this time, the test signal I$_{TX}$ is applied to the I channel path of the TX stage and the test signal Q$_{TX}$ is applied to the Q channel path of the TX stage. It is assumed that I$_{TX}$ and Q$_{TX}$ are 0 and 1, respectively.

The DSP applies LO$_{II}$ to mixer 260-I present on the I channel path of the RX stage and applies LO$_{QQ}$ to mixer 260-Q present on the Q channel path of the RX stage. Herein, LO$_{II}$ and LO$_{QQ}$ are the carriers defined to calibrate a TX mismatch.

The RF RX signal applied to mixer 260-I is output as a baseband signal according to LO$_{II}$. The baseband signal is applied to the DSP through LPF 270-I and ADC 280-I present on the I channel path. Further, the RF RX signal applied to mixer 260-Q is output as a baseband signal according to LO$_{QQ}$. The baseband signal is applied to the DSP through LPF 270-Q and ADC 280-Q present on the Q channel path.

The DSP receives V$_{II}$ applied through the I channel path and V$_{QQ}$ applied through the Q channel path. In step 334, the DSP 210 estimates a gain imbalance value α1 and a phase imbalance value φ1 using the received test signals V$_{II}$ and V$_{QQ}$. The gain imbalance value α1 and the phase imbalance value φ1 can be estimated by Equation (12).

Further, the DSP computes calibration values M and N for calibrating a mismatch between the I and Q channel paths of the TX stage using the gain imbalance value α1 and the phase imbalance value φ1. The calibration values M and N are computed using Equation (13).

The DSP can send a pre-distorted signal for calibrating the mismatch between the I and Q channel transmission signals in the TX stage according to the calibration values M and N. When the Q channel transmission signal multiplied by M added to the I channel transmission signal is output as an I channel transmission signal and the Q channel transmission signal multiplied by N is output as a Q channel transmission signal, a pre-distorted signal for calibrating the mismatch is sent.

Figure 4:
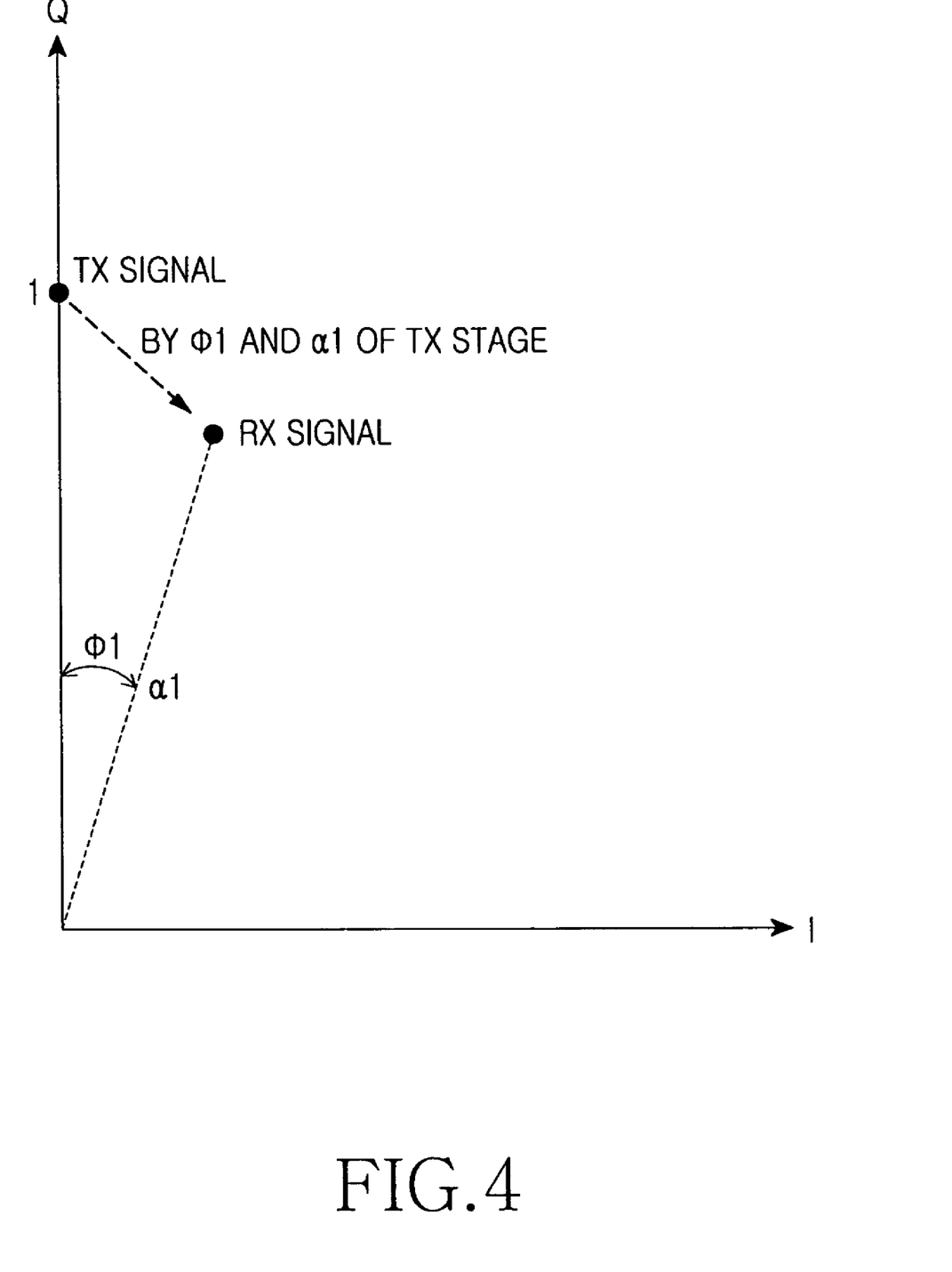
FIG. 4 illustrates a comparison between a test signal transmitted to a transmission stage and a test signal received by a reception stage in accordance with the present invention.

FIG. 4 illustrates a comparison between a test signal (or TX signal) transmitted to the TX stage and a test signal (or RX signal) received by the RX stage in accordance with the present invention. In FIG. 4, it is assumed that the DC offset and the mismatch have been already calibrated.

As seen from FIG. 4, the mismatch of the TX stage is caused by α1 and φ1 when the TX signal does not match the RX signal. After the mismatch of the TX stage has been calibrated, the TX signal matches the RX signal.

The present invention can easily calibrate the DC offset and the mismatch between I and Q channels using a transmitter and a receiver without additional circuitry and additional power consumption. This not only can minimize the production cost of a mobile terminal, but also can provide linearity with high adaptive capability as to environmental variations and digital self-calibration of a mismatch.

Moreover, the present invention accurately evaluates the DC offset and the mismatch in a mobile terminal even though the DC offset and the mismatch vary due to external factors, thereby enabling optimal performance and reducing calibration time.

What is claimed is:

1. A self-calibration method for use in a transceiver, comprising the steps of:
   generating an in-phase (I) channel test signal and a quadrature phase (Q) channel test signal in an analog baseband;
   converting the I and Q channel test signals generated in the analog baseband into radio frequency (RF) band signals and applying the RF band signals from a transmission stage to a reception stage through a test path;
   converting the applied RF band signals into analog baseband signals using a first carrier for the I channel and a first carrier for the Q channel applied as one pair and outputting a first I channel test signal and a first Q channel test signal;
   converting the applied RF band signals into analog baseband signals using a second cater for the I channel and a second carrier for the Q channel applied as one pair and outputting a second I channel test signal and a second Q channel test signal;
   calibrating a direct current (DC) offset for the I channel reception signal in the analog baseband of the reception stage using an average value of the first and second I channel test signals; and
   calibrating a DC offset for the Q channel reception signal in the analog baseband of the reception stage using the average value of the first and second Q channel test signals,
   wherein a phase difference between the first and second carriers for the I channel and the Q channel are 180 degrees, respectively.

2. The self-calibration method of claim 1, wherein the first carrier ($LO_{11}$) and the second carrier ($LO_{IQ}$) for the I channel are defined by $LO_{11}=\cos\omega t$ and $LO_{IQ}=-\cos\omega t$, respectively, and the first carrier ($LO_{QQ}$) and the second carrier ($LO_{QI}$) for the Q channel are defined by $LO_{QQ}=\alpha 2\sin(\omega t+\phi 2)$ and $LO_{QI}=-\alpha 2\sin(\omega t+\phi 2)$, respectively, where $\alpha 2$ is a gain imbalance value between an I channel path and a Q channel path of the reception stage and $\phi 2$ is a phase imbalance value between the I channel path and the Q channel path of the reception stage.

3. The self-calibration method of claim 2, further comprising:
   converting the applied RF band signals into analog baseband signals using a third carrier for the I channel and a third carrier for the Q channel applied as one pair and outputting a third I channel test signal ($V_{II}$) and a third Q channel test signal ($V_{QQ}$);
   converting the applied RF band signals into analog baseband signals using a fourth carrier for the I channel and a fourth carrier for the Q channel applied as one pair and outputting a fourth I channel test signal ($V_{IQ}$) and a fourth Q channel test signal ($V_{QI}$);
   computing the gain imbalance value ($\alpha 2$) of the reception stage by substituting the third and fourth I channel test signals ($V_{II}$ and $V_{IQ}$) into $$\alpha 2 = \sqrt{\frac{V_{QQ}^2 + V_{QI}^2}{V_{II}^2 + V_{IQ}^2}};$$

computing the phase imbalance value ($\phi 2$) of the reception stage by substituting the third and fourth I channel test signals ($V_{II}$ and $V_{IQ}$) into $$\phi 2 = \tan^{-1}\left(\frac{V_{II}\cdot V_{QQ} - V_{IQ}\cdot V_{QI}}{V_{II}\cdot V_{QI} + V_{QQ}\cdot V_{IQ}}\right);$$

computing calibration values (K and L) by substituting the gain imbalance value ($\alpha 2$) and the phase imbalance value ($\phi 2$) into $K=-\tan\phi 2$ and $$L = \frac{1}{\alpha 2\cos\phi 2}; \text{ and}$$

calibrating a mismatch between the I channel signal and the Q channel signal in a digital baseband of the reception stage using the calibration values (K and L),
   wherein a phase difference between the third carrier ($V_{II}$) and the fourth carrier ($V_{IQ}$) for the I channel and a phase difference between the third carrier ($V_{QQ}$) and the fourth carrier ($V_{QI}$) for the Q channel are 90 degrees, respectively.

4. The self-calibration method of claim 3, wherein the third carrier ($LO_{II}$) and the fourth carrier ($LO_{IQ}$) for the I channel are defined by $LO_{II}=\cos\omega t$ and $LO_{IQ}=\sin\omega t$, respectively, and
   the third carrier ($LO_{QQ}$) and the fourth carrier ($LO_{QI}$) for the Q channel are defined by $LO_{QQ}=\alpha 2\sin(\omega t+\phi 2)$ and $LO_{QI}=\alpha 2\cos(\omega t+\phi 2)$, respectively.

5. The self calibration method of claim 4, further comprising:
   converting an I channel test transmission signal ($I_{TX}$) and a Q channel test transmission signal ($Q_{TX}$) generated in an analog baseband of the transmission stage into RF band signals and applying the RF band signals to the reception stage through the test path after the DC offset and the mismatch are calibrated in the reception stage;
   converting the applied RF band signals into analog baseband signals according to a fifth carrier for the I channel and a fifth carrier for the Q channel applied as one pair and outputting a fifth I channel test signal and a fifth Q channel test signal;
   computing a gain imbalance value ($\alpha 1$) of the transmission stage by substituting the fifth I channel test signal ($V_{II}$) and the fifth Q channel test signals ($V_{QQ}$) corresponding to the analog baseband signals into $\alpha 1=\sqrt{V_{II}^2+V_{QQ}^2}$;
   computing a phase imbalance value ($\phi 1$) of the transmission stage by substituting the fifth I channel test signal ($V_{II}$) and the fifth Q channel test signals ($V_{QQ}$) corresponding to the analog baseband signals into $$\phi 1 = \tan^{-1}\frac{V_{II}}{V_{QQ}};$$

computing calibration values (M and N) by substituting the gain imbalance value ($\alpha 1$) and the phase imbalance value ($\phi 1$) into $M = -\tan\phi 1$ and $$N = \frac{1}{\alpha 1 \cos\phi 1}; \text{ and}$$

calibrating the mismatch between an I channel signal and a Q channel signal in a digital baseband of the transmission stage using the calibration values (M and N).

6. The self-calibration method of claim 5, wherein the I channel test transmission signal ($I_{TX}$) and the Q channel test transmission signal ($Q_{TX}$) are 0 and 1, respectively.

* * * * *